United States Patent
Kato et al.

(10) Patent No.: US 8,933,859 B2
(45) Date of Patent: Jan. 13, 2015

(54) ANTENNA DEVICE AND COMMUNICATION TERMINAL APPARATUS

(71) Applicant: Murata Manufacturing Co., Ltd., Nagaokakyo-shi, Kyoto-fu (JP)

(72) Inventors: Noboru Kato, Nagaokakyo (JP); Tsutomu Ieki, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 14/085,888

(22) Filed: Nov. 21, 2013

(65) Prior Publication Data

US 2014/0078014 A1 Mar. 20, 2014

Related U.S. Application Data

(63) Continuation of application No. PCT/JP2012/062577, filed on May 17, 2012.

(30) Foreign Application Priority Data

May 31, 2011 (JP) ................................ 2011-122909

(51) Int. Cl.
*H01Q 1/50* (2006.01)
*H03H 7/38* (2006.01)
*H04B 1/04* (2006.01)
*H01F 19/04* (2006.01)

(52) U.S. Cl.
CPC . *H01Q 1/50* (2013.01); *H03H 7/38* (2013.01); *H04B 1/0458* (2013.01); *H01F 19/04* (2013.01)
USPC ........................................................ 343/860

(58) Field of Classification Search
USPC ........................................................ 343/860
See application file for complete search history.

(56) References Cited

U.S. PATENT DOCUMENTS

| 2004/0217915 A1 | 11/2004 | Imaizumi |
| 2010/0109967 A1 | 5/2010 | Ranta |
| 2011/0309994 A1 | 12/2011 | Kato et al. |

FOREIGN PATENT DOCUMENTS

| JP | 03-080509 A | 4/1991 |
| JP | 2000-124728 A | 4/2000 |
| JP | 2004-336250 A | 11/2004 |
| JP | 2006-173697 A | 6/2006 |
| JP | 2008-035065 A | 2/2008 |
| JP | 2010-510706 A | 4/2010 |
| JP | 2012-084833 A | 4/2012 |
| JP | 2012-085250 A | 4/2012 |
| JP | 2012-085305 A | 4/2012 |

OTHER PUBLICATIONS

Official Communication issued in International Patent Application No. PCT/JP2012/062577, mailed on Jul. 10, 2012.

*Primary Examiner* — Graham Smith
(74) *Attorney, Agent, or Firm* — Keating & Bennett, LLP

(57) ABSTRACT

An antenna device includes an antenna element and an impedance conversion circuit connected to the antenna element. The impedance conversion circuit is inserted between the antenna element and a feeding circuit, and includes a first series circuit where a first coil conductor and a second coil conductor are connected in series, and a second series circuit where a third coil conductor and a fourth coil conductor are connected in series. The first and second coil conductors define a closed magnetic circuit through which a closed loop of a first magnetic flux passes, and the third and fourth coil conductors define a closed magnetic circuit through which a closed loop of a second magnetic flux passes. Consequently, the antenna device performs impedance matching with the feeding circuit in a wide frequency band.

20 Claims, 11 Drawing Sheets

ANTENNA DEVICE AND COMMUNICATION TERMINAL APPARATUS

BACKGROUND OF THE INVENTION

1. Field of the Invention

The present invention relates to an antenna device equipped with an impedance conversion circuit, and a communication terminal apparatus including the antenna device, and particularly to an antenna device that provides impedance matching in a wide frequency band, and to a communication terminal apparatus including the antenna device.

2. Description of the Related Art

In recent years, communication terminal apparatuses, such as mobile phones, may require compatibility with communication systems, such as a GSM (registered trademark) (Global System for Mobile communications), DCS (Digital Communication System), PCS (Personal Communication Services), and UMTS (Universal Mobile Telecommunications System), as well as a GPS (Global Positioning System), a wireless LAN, Bluetooth (registered trademark), and the like. Thus, antenna devices for such communication terminal apparatuses are required to cover a wide frequency band of 800 MHz to 2.4 GHz.

The antenna devices for a wide frequency band typically have a wideband matching circuit including an LC parallel resonant circuit or an LC series resonant circuit, as disclosed in Japanese Unexamined Patent Application Publication No. 2004-336250 and Japanese Unexamined Patent Application Publication No. 2006-173697. In addition, known examples of the antenna devices for a wide frequency band include tunable antennas as disclosed in Japanese Unexamined Patent Application Publication No. 2000-124728 and Japanese Unexamined Patent Application Publication No. 2008-035065.

However, since each of the matching circuits disclosed in Japanese Unexamined Patent Application Publication No. 2004-336250 and Japanese Unexamined Patent Application Publication No. 2006-173697 includes a plurality of resonant circuits, the insertion loss in the matching circuit is likely to increase and a sufficient gain may not be obtained in some cases.

On the other hand, since the tunable antennas disclosed in Japanese Unexamined Patent Application Publication No. 2000-124728 and Japanese Unexamined Patent Application Publication No. 2008-035065 require a circuit for controlling a variable capacitance element, that is, a switching circuit for switching frequency bands, the circuit configuration is likely to be complicated. Besides, since loss and distortion in the switching circuit are large, a sufficient gain may not possibly be obtained in some cases.

SUMMARY OF THE INVENTION

In view of the foregoing, preferred embodiments of the present invention provide an antenna device that performs impedance matching with a feeding circuit in a wide frequency band, and a communication terminal apparatus including the antenna device.

An antenna device according to a preferred embodiment of the present invention includes an antenna element; and an impedance conversion circuit connected to the antenna element; wherein the impedance conversion circuit includes a transformer circuit in which a first inductance element and a second inductance element are coupled to each other through a mutual inductance; the first inductance element includes a first end connected to a feeding circuit, and a second end connected to ground, respectively; the second inductance element includes a first end connected to the feeding circuit, and a second end connected to the antenna element, respectively; and the mutual inductance is larger than an inductance of the second inductance element.

The first inductance element may preferably include a first coil conductor and a second coil conductor; the second inductance element may preferably include a third coil conductor and a fourth coil conductor; the first coil conductor and the second coil conductor may preferably be wound so as to be electromagnetically coupled by a closed loop of a first magnetic flux that is generated by the first coil conductor and the second coil conductor; and the third coil conductor and the fourth coil conductor may preferably be wound so as to be electromagnetically coupled by a closed loop of a second magnetic flux that is generated by the third coil conductor and the fourth coil conductor.

The first coil conductor, the second coil conductor, the third coil conductor, and the fourth coil conductor may preferably be wound so that a magnetic flux (a magnetic flux passing through a first closed magnetic circuit) passing through the closed loop of the first magnetic flux and a magnetic flux (a magnetic flux passing through a second closed magnetic circuit) passing through the closed loop of the second magnetic flux are in directions opposite to each other.

The first coil conductor and the third coil conductor may preferably be coupled to each other through a magnetic field and an electric field; the second coil conductor and the fourth coil conductor may preferably be coupled to each other through a magnetic field and an electric field; and when an alternating current flows in the first inductance element, a direction of a current that flows in the second inductance element as a result of coupling through the magnetic field may preferably be the same as a direction of a current that flows in a second inductance element as a result of coupling through the electric field.

The first coil conductor, the second coil conductor, the third coil conductor, and the fourth coil conductor may preferably include conductor patterns in a laminate in which a plurality of dielectric layers or magnetic layers are laminated on each other.

A winding axis of the first coil conductor, a winding axis of the second coil conductor, a winding axis of the third coil conductor, and a winding axis of the fourth coil conductor may preferably be oriented in a lamination direction of the laminate; the winding axes of the first coil conductor and the second coil conductor may preferably be juxtaposed so that the respective winding axes have a different relationship; the winding axes of the third coil conductor and the fourth coil conductor may preferably be juxtaposed so that the respective winding axes have a different relationship; a winding area of the first coil conductor and a winding area of the third coil conductor may preferably overlap each other at least partially in a plan view and a winding area of the second coil conductor and a winding area of the fourth coil conductor may preferably overlap each other at least partially in a plan view.

The impedance conversion circuit may preferably further include a fifth coil conductor and a sixth coil conductor; the fifth coil conductor and the sixth coil conductor may preferably be connected in series to define a third inductance element; the fifth coil conductor and the sixth coil conductor may preferably be wound so as to be electromagnetically coupled (to define a third closed magnetic circuit) by a closed loop of a third magnetic flux that is generated by the fifth coil conductor and the sixth coil conductor; the third inductance element may preferably include a first end connected to the feeding circuit, and a second end connected to the ground; the first coil conductor, the second coil conductor, the third coil conductor, the fourth coil conductor, the fifth coil conductor, and the sixth coil conductor may preferably be so arranged that a magnetic flux passing through the closed loop of the second magnetic flux is sandwiched between a magnetic flux passing through the closed loop of the first magnetic flux and a magnetic flux wound around the closed loop of the third magnetic flux.

The impedance conversion circuit further may preferably further include a fifth coil conductor and a sixth coil conductor; the fifth coil conductor and the sixth coil conductor may preferably be connected in series to define a third inductance element; the fifth coil conductor and the sixth coil conductor may preferably be wound so as to be electromagnetically coupled (to define a third closed magnetic circuit) by a closed loop of a third magnetic flux that is generated by the fifth coil conductor and the sixth coil conductor; the third inductance element may preferably include a first end connected to the feeding circuit, and a second end connected to the ground; the first coil conductor, the second coil conductor, the third coil conductor, the fourth coil conductor, the fifth coil conductor, and the sixth coil conductor may preferably be so arranged that a magnetic flux passing through the closed loop of the first magnetic flux is sandwiched between a magnetic flux passing through the closed loop of the second magnetic flux and a magnetic flux wound around the closed loop of the third magnetic flux in the lamination direction.

A communication terminal apparatus according to a preferred embodiment of the present invention includes an antenna device including an antenna element; a feeding circuit; and an impedance conversion circuit connected between the antenna element and the feeding circuit, wherein the impedance conversion circuit includes a transformer circuit in which a first inductance element and a second inductance element are coupled to each other through a mutual inductance; the first inductance element may preferably include a first end connected to the feeding circuit, and a second end connected to ground, respectively; the second inductance element may preferably include a first end connected to the feeding circuit, and a second end connected to the antenna element, respectively; and the mutual inductance is larger than an inductance of the second inductance element.

According to a preferred embodiment of the present invention, an antenna device in which an insertion loss in a matching circuit is small; a switching circuit to switch frequency bands is not required; and impedance matching with a feeding circuit is performed over a wide frequency band, and a communication terminal apparatus equipped with the antenna device is provided.

In addition, according to a communication terminal apparatus of a preferred embodiment of the present invention, the communication terminal apparatus includes the antenna device according to one of the preferred embodiments described above and thus can be compatible with various communication systems having different frequency bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
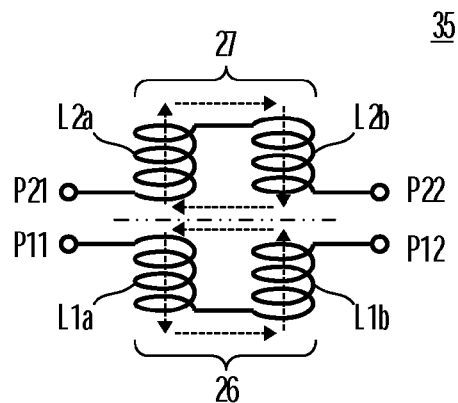
FIG. 1A is a circuit diagram of a main portion of an impedance conversion circuit 35 included in an antenna device 101 of a first preferred embodiment of the present invention.
Figure 1B:
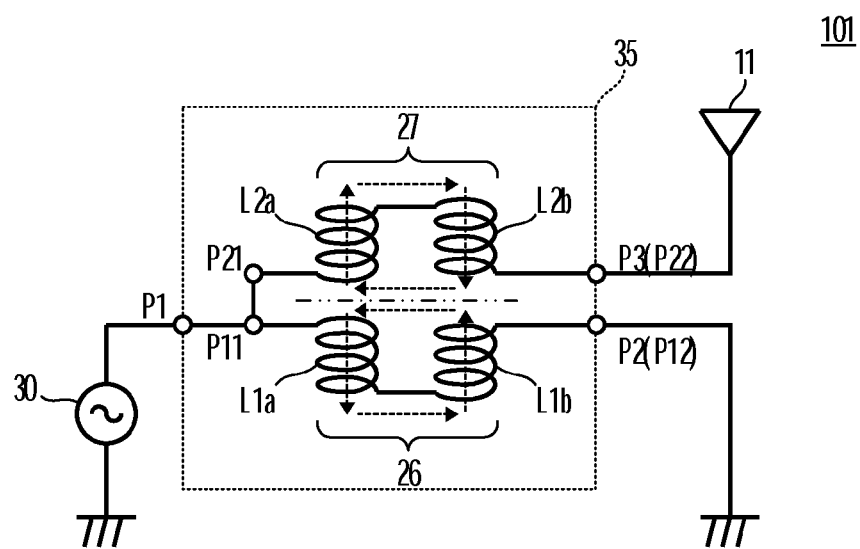
FIG. 1B is a circuit diagram of the antenna device 101.

FIG. 1A is a circuit diagram of a main portion of an impedance conversion circuit 35 included in an antenna device 101 of a first preferred embodiment of the present invention, and FIG. 1B is a circuit diagram of the antenna device 101. As illustrated in FIG. 1A, the impedance conversion circuit 35 includes a first coil conductor L1a, a second coil conductor L1b, a third coil conductor L2a, and a fourth coil conductor L2b. The first coil conductor L1a and the second coil conductor L1b are connected in series and define a first series circuit 26, and the third coil conductor L2a and the fourth coil conductor L2b are connected in series and define a second series circuit 27.

The first coil conductor L1a and the second coil conductor L1b may preferably be wound so as to be electromagnetically coupled by a closed loop of a first magnetic flux generated by the first coil conductor L1a and the second coil conductor L1b. Similarly, the third coil conductor L2a and the fourth coil conductor L2b may preferably be wound so as to be electromagnetically coupled by a closed loop of a second magnetic flux generated by the third coil conductor L2a and the fourth coil conductor L2b.

As illustrated in FIG. 1B, the antenna device 101 includes an antenna element 11 and an impedance conversion circuit 35 connected to this antenna element 11. The antenna element 11 is a monopole antenna, for example. The first end P11 of the first series circuit 26 and the first end P21 of the second series circuit 27 are connected to the first port P1 of the impedance conversion circuit 35. The second end P12 of the first series circuit 26 is connected to the second port P2 of the impedance conversion circuit 35. In addition, the second end P22 of the second series circuit 27 is connected to the third port P3 of the impedance conversion circuit 35.

The third port P3 of the impedance conversion circuit 35 is connected to the antenna element 11, and the second port P2 is grounded to the ground. The first port P1 of the impedance conversion circuit 35 is connected to a feeding circuit 30. The feeding circuit 30 is a feeding circuit that feeds a high-frequency signal to the antenna element 11, generates or processes the high-frequency signal, and may include a circuit that multiplexes and demultiplexes the high-frequency signal.

Figure 2:
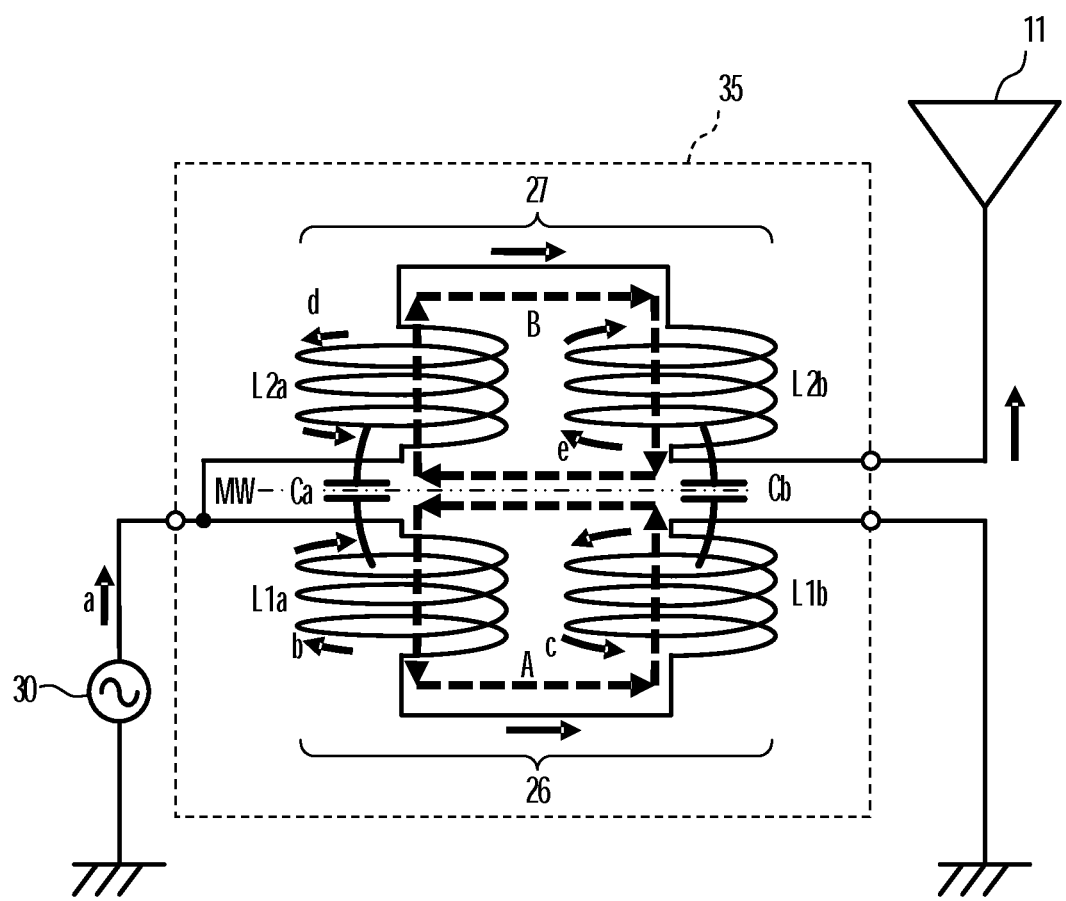
FIG. 2 is a diagram in which various arrows indicating the states of magnetic field coupling and electric field coupling are illustrated in the circuit illustrated in FIG. 1B.

FIG. 2 is a view in which various arrows indicating the states of magnetic field coupling and electric field coupling are illustrated in the circuit illustrated in FIG. 1B.

As illustrated in FIG. 2, when a current is supplied from the feeding circuit 30 in a direction indicated by arrow a in the figure, a current flows in the first coil conductor L1a in a direction indicated by arrow b in the figure and also a current flows in the coil conductor L1b in a direction indicated by arrow c in the figure. Those currents generate a magnetic flux (a magnetic flux passing through a closed magnetic circuit), as indicated by arrow A in the figure.

Since the first coil conductor L1a and the third coil conductor L2a have coil conductor patterns that are parallel or substantially parallel to each other in a plan view state so as to share a coil winding axis, electric-field coupling between the first coil conductor L1a and the third coil conductor L2a is generated and the electric-field coupling causes a current to flow in the same direction as the induced current. In other words, the magnetic-field coupling and the electric-field coupling increase the degree of coupling. Similarly, the magnetic-field coupling and the electric-field coupling are also generated between the second coil conductor L1b and the fourth coil conductor L2b. Capacitors Ca and Cb in FIG. 2 each symbolically represent a coupling capacitance for the electric-field coupling.

The first coil conductor L1a and the second coil conductor L1b are coupled to each other in the same phase and the third coil conductor L2a and the fourth coil conductor L2b are coupled to each other in the same phase to define respective closed magnetic circuits. Accordingly, the two magnetic fluxes A and B are confined, so that the amount of energy loss between the first coil conductor L1a and the second coil conductor L1b, and between the third coil conductor L2a and the fourth coil conductor L2b can be reduced. It is to be noted by setting an inductance value for the first coil conductor L1a and the second coil conductor L1b to an element value substantially the same as an inductance value for the third coil conductor L2a and the fourth coil conductor L2b, leakage of a magnetic field in a closed magnetic circuit is significantly reduced and the amount of energy loss is further reduced. Naturally, an impedance conversion ratio can be controlled by appropriately designing an element value of the respective coil conductors.

In a similar manner, the magnetic flux A excited by a first current flowing in the first series circuit 26 and the magnetic flux B excited by a second current flowing in the second series circuit 27 are generated so that induced currents cause the magnetic fluxes to reject (repel) each other. Therefore, an equivalent magnetic barrier MW is generated between the first series circuit 26 and the second series circuit 27. As a result, the magnetic field generated in the first coil conductor L1a and the second coil conductor L1b and the magnetic field generated in the third coil conductor L2a and the fourth coil conductor L2b are confined in respective small spaces, and thus, the first coil conductor L1a and the third coil conductor L2a, and the second coil conductor L1b and the fourth coil conductor L2b are coupled to each other, respectively, at higher degrees of coupling. In other words, the first series circuit 26 and the second series circuit 27 are coupled to each other with a high degree of coupling.

Figure 3A:
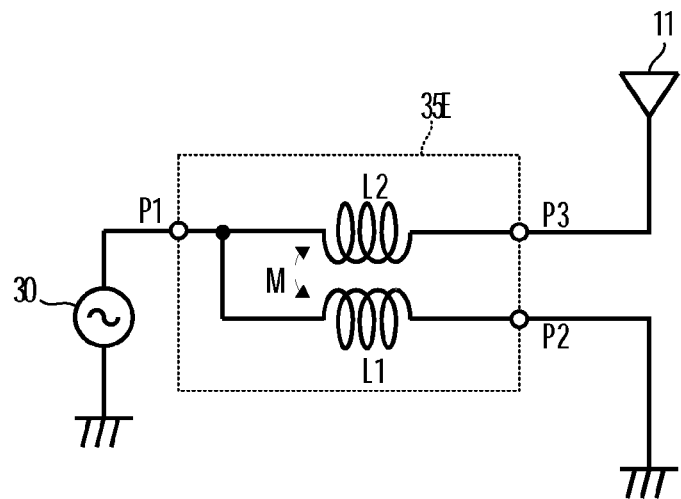
FIG. 3A is a circuit diagram illustrating equivalent transformation of the antenna device 101 of the first preferred embodiment.
Figure 3B:
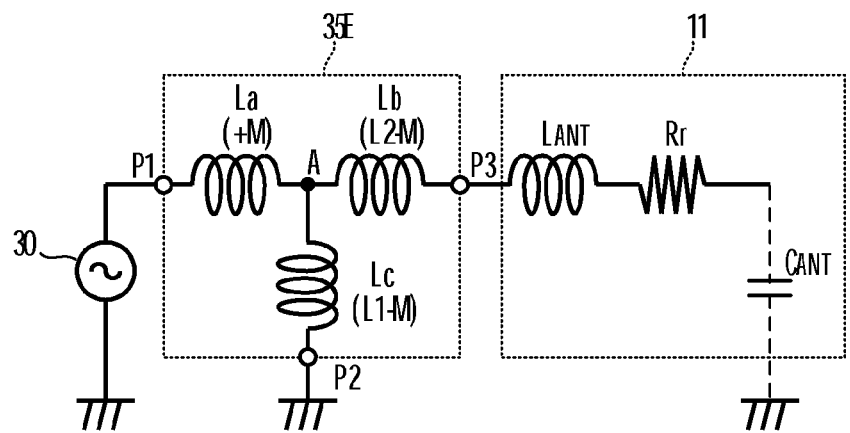
FIG. 3B is a circuit diagram illustrating further equivalent transformation of the equivalently transformed antenna device 101 of the first preferred embodiment.

FIG. 3A is a circuit diagram illustrating equivalent transformation of the antenna device 101 of the first preferred embodiment; and FIG. 3B is a circuit diagram illustrating further equivalent transformation of the equivalently transformed antenna device 101 of the first preferred embodiment. An impedance conversion circuit 35E is a view in which the impedance conversion circuit 35 is illustrated in FIG. 1B as a simple transformer circuit. In this preferred embodiment, the inductance of the first series circuit 26 connected to the feeding circuit 30 illustrated in FIG. 1B is represented by L1 and the inductance of the second series circuit 27 connected to the feeding circuit 30 illustrated in FIG. 1B is represented by L2.

In FIG. 3B, the impedance conversion circuit 35E is a view in which the transformer circuit illustrated in FIG. 3A is equivalently transformed into a T-type circuit including inductance elements La, Lb, and Lc. In this preferred embodiment, a mutual inductance of the inductance L1 and the inductance L2 can be represented by M, an inductance of the inductance element La can be expressed as (+M), an inductance of the inductance element Lb can be expressed as (L2−M), and an inductance of the inductance element Lc can be expressed as (L1−M). If the relationship L2<M is satisfied, the inductance (L2−M) of the inductance element Lb has a negative value.

The antenna element 11 is equivalently defined by an inductance component LANT, a radiation resistance component Rr, and a capacitance component CANT. The inductance component LANT of the antenna element 11 alone acts so as to be canceled by the negative composite inductance component (L2−M) in the impedance conversion circuit 35E. In other words, the inductance component (of the antenna element 11 including the inductance element (L2−M)), when the antenna element 11 side is viewed from a point A in the impedance conversion circuit 35E, is reduced (ideally, to zero), and consequently, the impedance frequency characteristic of the antenna device 101 is reduced.

In order to generate a negative inductance component in the manner described above, it is important to cause the first inductance element and the second inductance element to be coupled to each other with a high degree of coupling.

The impedance conversion ratio of the transformer-type circuit, in a case in which an inductance of the inductance element L1 is represented by L1 and an inductance of the inductance element L2 is represented by L2, is L1:(L1+L2).

Figure 4:
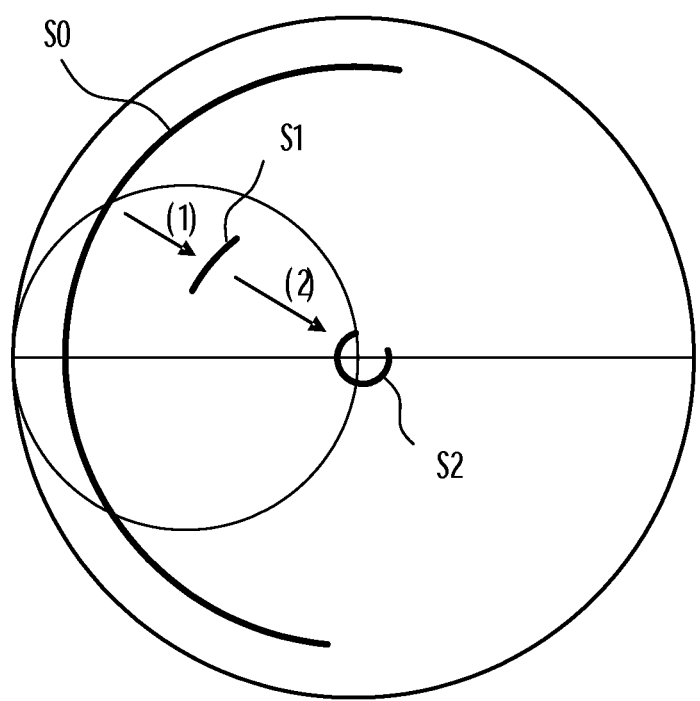
FIG. 4 is a view schematically illustrating an effect of a negative inductance component equivalently generated in an impedance conversion circuit 35 and an effect of the impedance conversion circuit 35.

FIG. 4 is a view schematically illustrating an effect of a negative inductance component equivalently generated in the impedance conversion circuit 35 and an effect of the impedance conversion circuit 35. In FIG. 4, a curve S0 represents, on a Smith chart, an impedance trace obtained by sweeping the frequency over a frequency band used by the antenna element 11. Since the inductance component LANT of the antenna element 11 alone is relatively large, the impedance changes significantly as illustrated in FIG. 4.

In FIG. 4, a curve S1 represents an impedance trace when the antenna element 11 side is viewed from a point A in the impedance conversion circuit. As illustrated, the equivalent negative inductance component of the impedance conversion circuit cancels the inductance component LANT of the antenna element, so that the impedance trace as viewed from the point A to the antenna element side is significantly reduced.

A curve S2 in FIG. 4 represents a trace of impedance as viewed from the feeding circuit 30, i.e., impedance of the antenna device 101. As illustrated, in accordance with the impedance conversion ratio L1:(L1+L2) of the transformer-type circuit, the impedance of the antenna device 101 approaches the impedance of the feeding circuit 30 (the center of the Smith chart). It should be noted that the impedance may be finely adjusted by adding an inductance element and/or a capacitance element to the transformer-type circuit.

In this way, changes in impedance of the antenna device are effectively prevented over a wide band. Therefore, it is possible to provide impedance matching between the feeding circuit and the antenna device over a wide frequency band.

Figure 5:
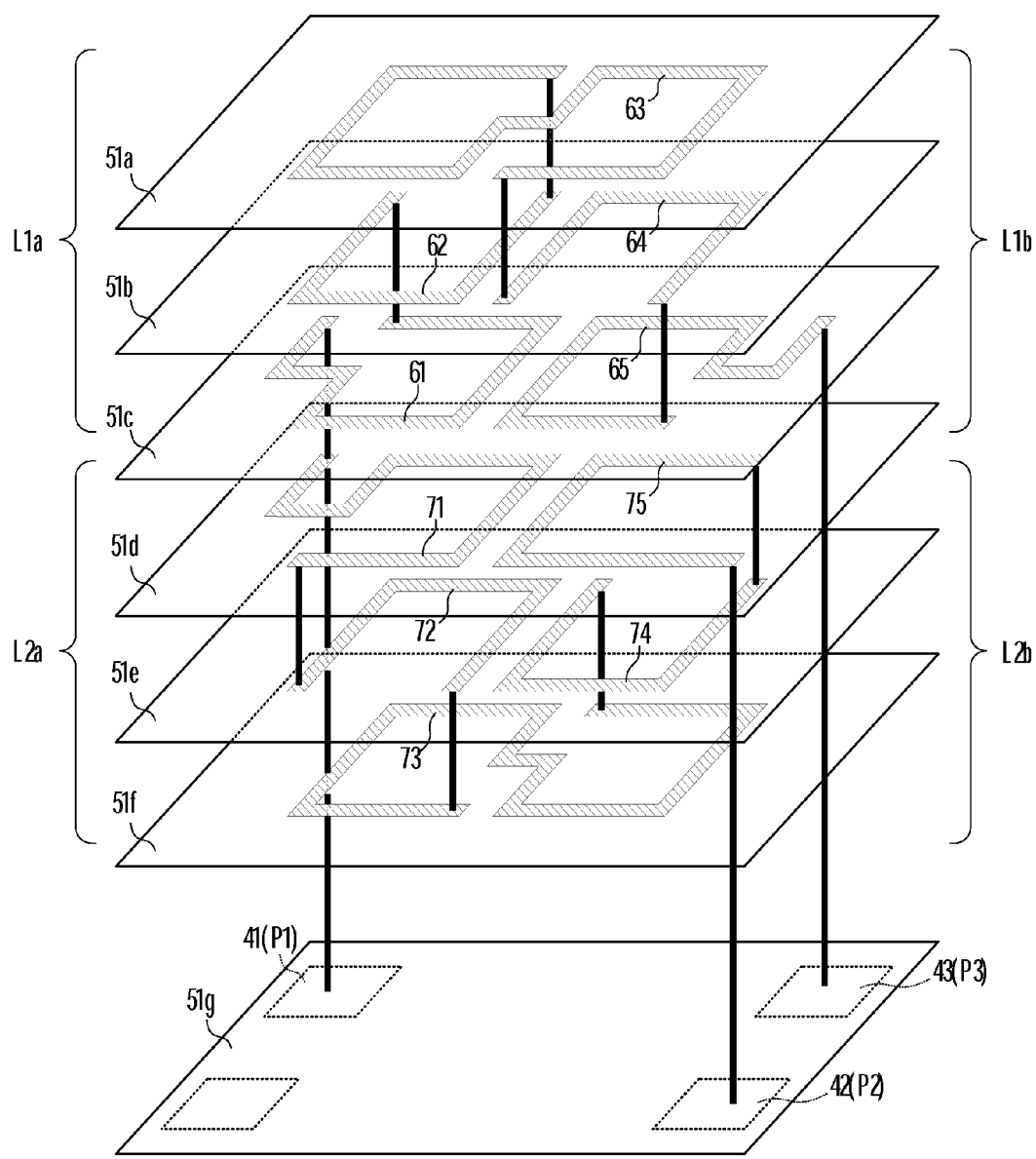
FIG. 5 is an exploded perspective view of a laminate when the impedance conversion circuit 35 is configured in the laminate (a multilayer substrate) in which a plurality of dielectric layers or magnetic layers are laminated on each other.

FIG. 5 is an exploded perspective view of a laminate when the impedance conversion circuit 35 is configured in the laminate (a multilayer substrate) in which a plurality of dielectric layers or magnetic layers are laminated on each other. In FIG. 5, each base material layer is seen through and each conductor pattern and each interlayer connection conductor (a via conductor) are illustrated.

As illustrated in FIG. 5, a conductor pattern 63 is provided on the base material layer 51a, conductor patterns 62 and 64 are provided on the base material layer 51b, and conductor patterns 61 and 65 are provided on the base material layer 51c. In a similar manner, conductor patterns 71 and 75 are provided on the base material layer 51d, conductor patterns 72 and 74 are provided on the base material layer 51e, and a conductor pattern 73 is provided on the base material layer 51f. On the reverse side of a base material layer 51g, a terminal 41 corresponding to the port P1, a terminal 42 corresponding to the port P2, and a terminal 43 corresponding to the port P3 are provided. It is to be noted a plain base material layer, which is not illustrated, is laminated on the base material layer 51a.

The conductor patterns 61 and 62 and the left half of the conductor pattern 63 define the first coil conductor L1a, and the right half of the conductor pattern 63 and the conductor patterns 64 and 65 define the second coil conductor L1b. In a similar manner, the conductor patterns 71 and 72 and the left half of the conductor pattern 73 define the third coil conductor L2a, and the right half of the conductor pattern 73 and the conductor patterns 74 and 75 define the fourth coil conductor L2b.

By laminating the base material layers 51a to 51g, the conductor patterns 61 to 65, 71 to 75, and the terminals 41, 42, and 43 are connected through the interlayer connection conductors (the via conductors), and the circuit illustrated in FIG. 1B is defined. As illustrated in FIG. 5, the first coil conductor L1a and the second coil conductor L1b are adjacently arranged so that the winding axes of the coil patterns of the respective conductors are parallel or substantially parallel to each other. Similarly, the third coil conductor L2a and the fourth coil conductor L2b are adjacently arranged so that the winding axes of the coil patterns of the respective conductors are parallel or substantially parallel to each other. Furthermore, the first coil conductor L1a and the third coil conductor L2a are proximately arranged (in a coaxial relationship) so that the winding axes of the coil patterns of the respective conductors are along substantially the same straight line. Similarly, the second coil conductor L1b and the fourth coil conductor L2b are proximately arranged (in a coaxial relationship) so that the winding axes of the coil patterns of the respective conductors extend along substantially the same straight line. In other words, when viewed from the lamination direction of the base material layers, the conductor patterns that define the respective coil patterns are arranged so as to overlap each other.

It should be noted while each of the coil conductors L1a, L1b, L2a, and L2b is defined by a substantially three-turn loop conductor, the number of turns is not limited thereto. In addition, the winding axes of the coil patterns of the first coil conductor L1a and the third coil conductor L2a do not necessarily have to be arranged so as to extend strictly along the same straight line, and may be wound so that coil openings of the first coil conductor L1a and the third coil conductor L2a overlap each other in a plan view. Similarly, the winding axes of the coil patterns of the second coil conductor L1b and the fourth coil conductor L2b do not necessarily have to be arranged so as to be strictly along the same straight line, and may be wound so that coil openings of the second coil conductor L1b and the fourth coil conductor L2b overlap each other in a plan view.

The various conductor patterns 61 to 65 and 71 to 75 can be formed preferably by screen printing using a paste containing conductive material, such as silver or copper, as a main component, metallic-foil etching, or the like. For the base material layers 51a to 51g, a glass ceramic material, an epoxy resin material, or the like can be used in the case of a dielectric substance and a ferrite ceramic material, a resin material containing ferrite, or the like can be used in the case of a magnetic substance. As a material for the base material layers, especially when an impedance conversion circuit for a UHF band is to be provided, a dielectric material having a high electrical insulation resistance is preferably used in order to suppress an eddy current loss in a high frequency region. Since the eddy current loss is relatively small when a common-mode choke coil for an HF band is defined, a magnetic substance material (a dielectric material having a high permeability) may be preferably used in respect of the confinement property of magnetic energy.

It is to be noted a magnetic layer may be arranged between the conductor patterns 61 to 65 that define the first coil element L1a and the second coil element L1b, and the conductor patterns 71 to 75 that define the third coil element L2a and the fourth coil element L2b, and the other layers may be defined by dielectric layers. This enhances the magnetic coupling between the first coil element L1a and the second coil element L1b and the magnetic coupling between the third coil element L2a and the fourth coil element L2b almost without increasing the eddy current loss.

Figure 6:
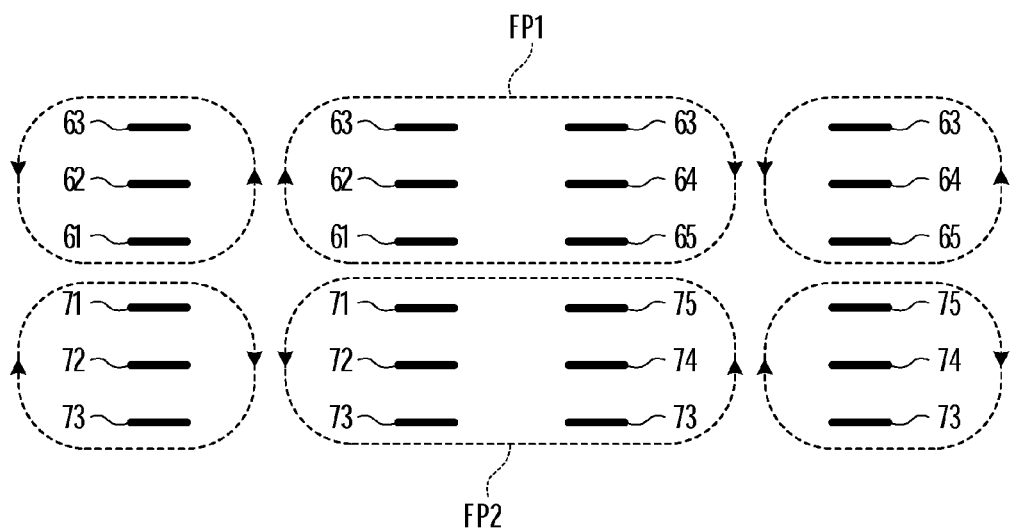
FIG. 6 is a view illustrating major magnetic fluxes that pass through coil conductors having conductor patterns provided at the layers of the multilayer substrate illustrated in FIG. 5.

FIG. 6 is a view illustrating major magnetic fluxes that pass through coil conductors having conductor patterns provided at the layers of the multilayer substrate illustrated in FIG. 5. A magnetic flux FP1 passes through the first coil conductor L1a defined by the conductor patterns 61 to 63, and the second coil conductor L1b defined by the conductor patterns 63 to 65. In a similar manner, a magnetic flux FP2 also passes through the third coil conductor L2a defined by the conductor patterns 71 to 73, and the fourth coil conductor L2b defined by the conductor patterns 73 to 75.

As described above, by disposing the coil conductor L1a, L1b, L2a, and L2b in the laminate made of a dielectric or a magnetic substance, in particular, disposing a region serving as a coupling portion between the first series circuit and the second series circuit in the laminate, the impedance conversion circuit 35 becomes less susceptible to an influence from another circuit or element disposed adjacent to the laminate. As a result, the impedance matching is further stabilized.

Second Preferred Embodiment

Figure 7:
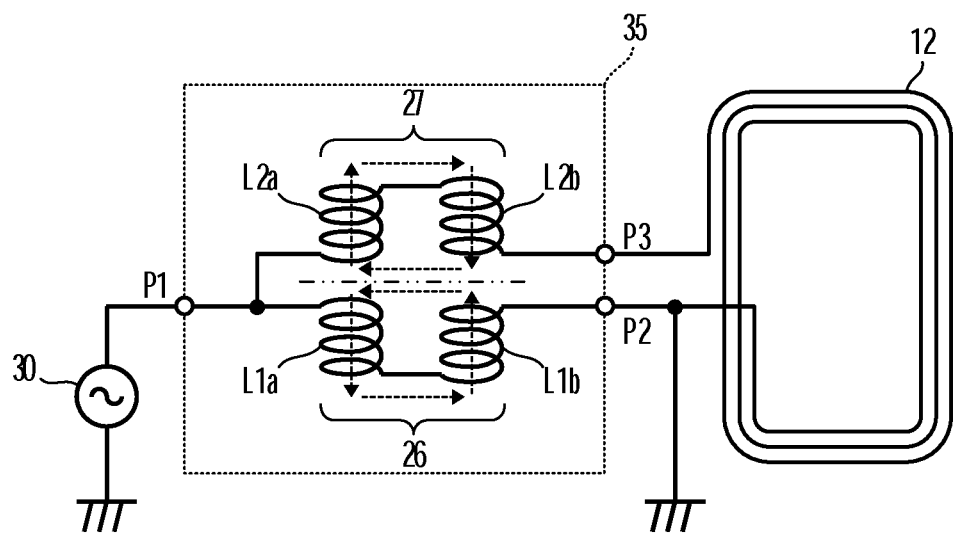
FIG. 7 is a circuit diagram of an antenna device 102 of a second preferred embodiment of the present invention.

FIG. 7 is a circuit diagram of an antenna device 102 of a second preferred embodiment of the present invention. As illustrated in FIG. 7, the antenna device 102 includes an antenna element 12 and an impedance conversion circuit 35 connected to this antenna element 12. The antenna element 12 is a loop antenna. The first end of the first series circuit 26 and the first end of the second series circuit 27 are connected to the first port P1 of the impedance conversion circuit 35. The second end of the first series circuit 26 is connected to the second port P2 of the impedance conversion circuit 35. In addition, the second end of the second series circuit 27 is connected to the third port P3 of the impedance conversion circuit 35.

Between the second port P2 and the third port P3 of the impedance conversion circuit 35, the antenna element 12 is connected, and the second port P2 is grounded to ground. The first port P1 of the impedance conversion circuit 35 is connected to a feeding circuit 30. The feeding circuit 30 is a feeding circuit that feeds a high-frequency signal to the antenna element 12, generates or processes the high-frequency signal, and may include a circuit that multiplexes and demultiplexes the high-frequency signal.

The antenna device 102 according to this second preferred embodiment is, for example, an antenna device for an RFID tag, the antenna element 12 is a comparatively large loop antenna provided aside from an IC chip for the RFID, and the impedance is approximately two times larger than the impedance of the feeding circuit 30. The impedance conversion ratio of the impedance conversion circuit 35 preferably is about 1:2, for example. Therefore, the impedance matching between the feeding circuit 30 and the antenna element 12 of this antenna device 102 is performed.

Third Preferred Embodiment

Figure 8:
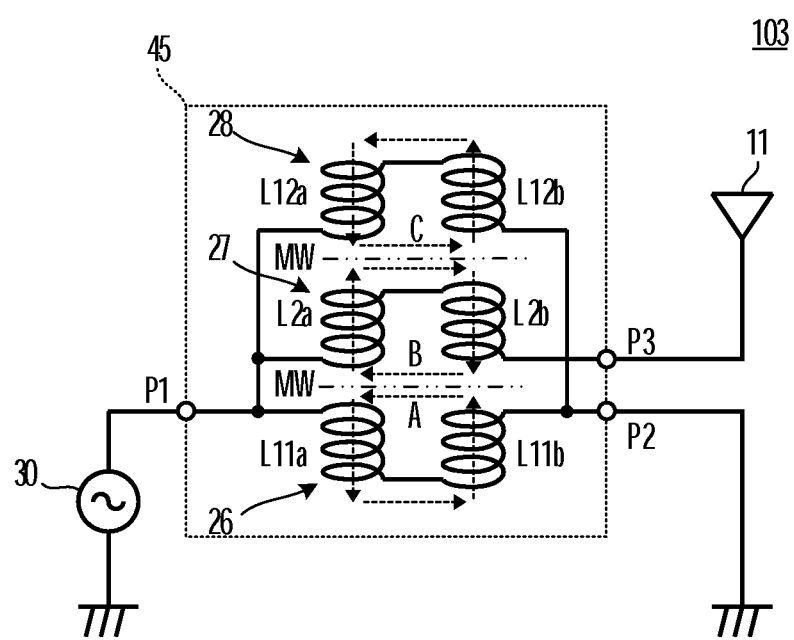
FIG. 8 is a circuit diagram of an antenna device 103 of a third preferred embodiment of the present invention.

FIG. 8 is a circuit diagram of an antenna device 103 of a third preferred embodiment of the present invention. As illustrated in FIG. 8, the antenna device 103 includes an antenna element 11 and an impedance conversion circuit 45 connected to this antenna element 11. The first end of the first series circuit 26, the first end of the second series circuit 27, and the first end of the third series circuit 28 are connected to the first port P1 of the impedance conversion circuit 45, respectively. The second end of the first series circuit 26 and the second end of the third series circuit 28 are connected to the second port P2 of the impedance conversion circuit 45. In addition, the second end of the second series circuit 27 is connected to the third port P3 of the impedance conversion circuit 45.

The closed loop A of the magnetic flux excited by a primary current flowing in the first series circuit 26 and the closed loop B of the magnetic flux excited by a secondary current flowing in the second series circuit 27 are generated so that induced currents cause the magnetic fluxes to reject (repel) each other. Therefore, an equivalent magnetic barrier MW is generated between the first series circuit 26 and the second series circuit 27.

In a similar manner, the closed loop C of the magnetic flux excited by a primary current flowing in the third series circuit 28 and the closed loop B of the magnetic flux excited by a secondary current flowing in the second series circuit 27 are generated so that induced currents cause the magnetic fluxes to reject (repel) each other. Therefore, an equivalent magnetic barrier MW is generated between the third series circuit 28 and the second series circuit 27.

In this way, according to a structure in which the closed loop B of the magnetic flux of the secondary side coil in the center is sandwiched between the upper and lower closed loops A and C of the magnetic fluxes of the primary side coils, the closed loop B of the magnetic flux of the secondary side coil in the center is sandwiched by two magnetic barriers and is sufficiently confined (the effect of being confined is enhanced). In other words, it is possible to cause the impedance conversion circuit according to the present preferred embodiment to act as a transformer having a larger coupling coefficient.

Figure 9:
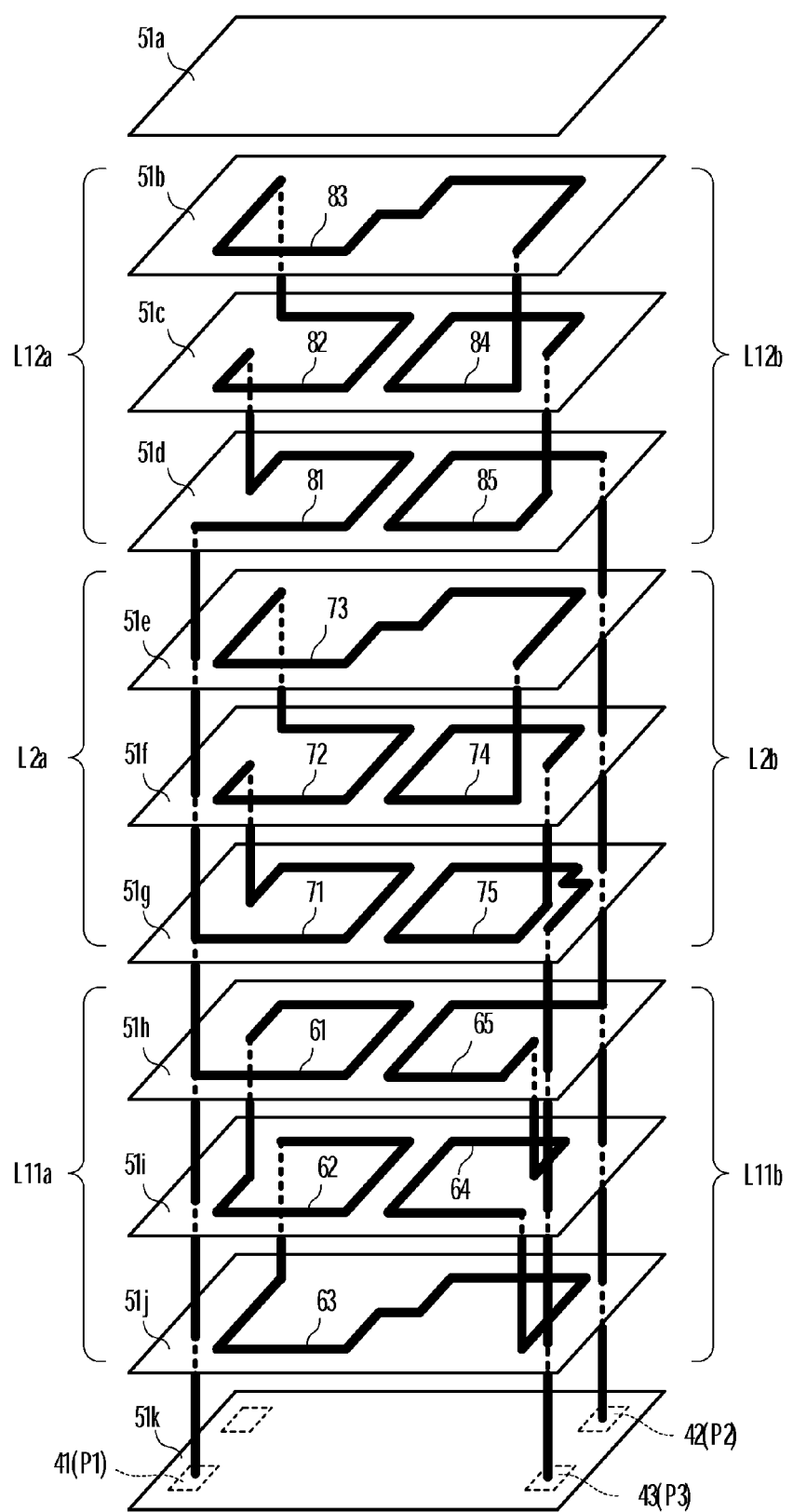
FIG. 9 is an exploded perspective view of a laminate when a impedance conversion circuit 45 illustrated in FIG. 8 is configured in the laminate (a multilayer substrate) in which a plurality of dielectric layers or magnetic layers are laminated on each other.

FIG. 9 is an exploded perspective view of a laminate when the impedance conversion circuit 45 illustrated in FIG. 8 is configured in a laminate (a multilayer substrate) in which a plurality of dielectric layers or magnetic layers are laminated on each other. As illustrated in FIG. 9, the base material layers 51a to 51k are preferably defined either by a dielectric sheet or a magnetic sheet, and a coil conductor is defined on each layer. A conductor pattern 83 is provided on the base material layer 51b, conductor patterns 82 and 84 are provided on the base material layer 51c, conductor patterns 81 and 85 are provided on the base material layer 51d, a conductor pattern 73 is provided on the base material layer 51e, conductor patterns 72 and 74 are provided on the base material layer 51f, conductor patterns 71 and 75 are provided on the base material layer 51g, conductor patterns 61 and 65 are provided on the base material layer 51h, conductor patterns 62 and 64 are provided on the base material layer 51i, and a conductor pattern 63 is provided on the base material layer 51j. On the lower surface of the base material layer 51k, terminals 41, 42, and 43 and the like that are corresponding to ports P1, P2, and P3 are defined. Lines extending vertically in FIG. 9 represent via electrodes that provide inter-layer connections between the corresponding coil conductors.

In FIG. 9, the conductor patterns 61 and 62 and the left half of the conductor pattern 63 define a first coil conductor L11a, and the conductor patterns 64 and 65 and the right half of the conductor pattern 63 define a second coil conductor L11b. In a similar manner, the conductor patterns 81 and 82 and the left half of the conductor pattern 83 define a fifth coil conductor L12a, and the conductor patterns 85 and 84 and the right half of the conductor pattern 83 define a sixth coil conductor L12b. In a further similar manner, the conductor patterns 71 and 72 and the left half of the conductor pattern 73 define a third coil conductor L2a, and the conductor patterns 75 and 74 and the right half of the conductor pattern 73 define a fourth coil conductor L2b.

Fourth Preferred Embodiment

Figure 10:
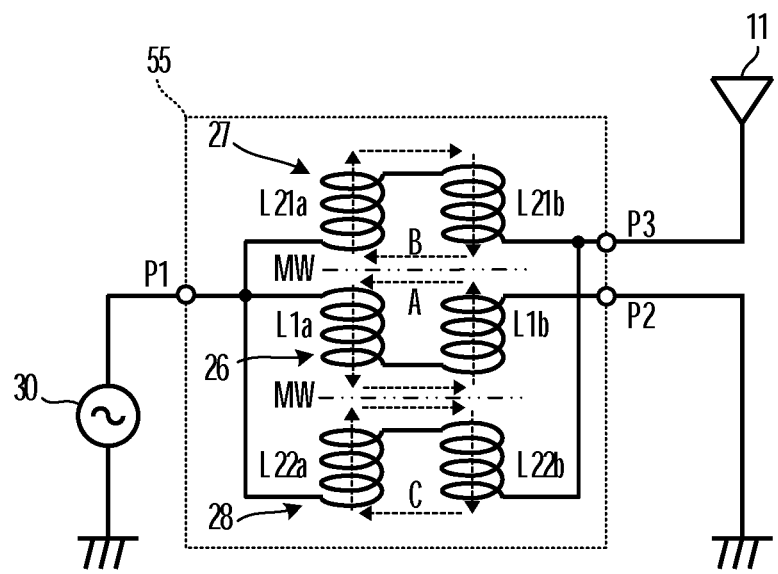
FIG. 10 is a circuit diagram of an antenna device 104 of a fourth preferred embodiment of the present invention.

FIG. 10 is a circuit diagram of an antenna device 104 of a fourth preferred embodiment of the present invention. As illustrated in FIG. 10, the antenna device 104 includes an antenna element 11 and an impedance conversion circuit 55 connected to this antenna element 11. The first end of the first series circuit 26, the first end of the second series circuit 27, and the first end of the third series circuit 28 are connected to the first port P1 of the impedance conversion circuit 55, respectively. The second end of the first series circuit 26 is connected to the second port P2 of the impedance conversion circuit 55. In addition, the second end of the second series circuit 27 and the second end of the third series circuit 28 are connected to the third port P3 of the impedance conversion circuit 55.

The closed loop A of the magnetic flux excited by a primary current flowing in the first series circuit 26 and the closed loop B of the magnetic flux excited by a secondary current flowing in the second series circuit 27 are generated so that induced currents cause the magnetic fluxes to reject (repel) each other. Therefore, an equivalent magnetic barrier MW is generated between the first series circuit 26 and the second series circuit 27.

In a similar manner, the closed loop A of the magnetic flux excited by a primary current flowing in the first series circuit 26 and the closed loop C of the magnetic flux excited by a secondary current flowing in the third series circuit 28 are generated so that induced currents cause the magnetic fluxes to reject (repel) each other. Therefore, an equivalent magnetic barrier MW is generated between the first series circuit 26 and the third series circuit 28.

In this way, according to a structure in which the closed loop A of the magnetic flux of the primary side coil in the center is sandwiched between the upper and lower closed loops B and C of the magnetic fluxes of the secondary side coils, the closed loop A of the magnetic flux of the primary side coil in the center is sandwiched by two magnetic barriers and is sufficiently confined (the effect of being confined is enhanced). In other words, it is possible to cause the impedance conversion circuit according to the present preferred embodiment to act as a transformer having a very large coupling coefficient.

Fifth Preferred Embodiment

Figures 11A, 11B:
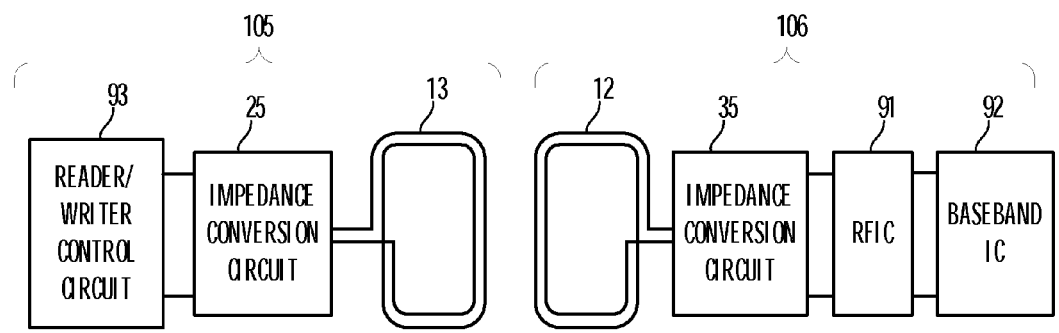
FIG. 11A is a view illustrating a configuration of a communication terminal apparatus as a first example of a fifth preferred embodiment of the present invention.
FIG. 11B is a view illustrating a configuration of a communication terminal apparatus as a second example of the fifth preferred embodiment.

A fifth preferred embodiment provides an example of a communication terminal apparatus. FIGS. 11A and 11B are RFID system circuit diagrams that illustrate examples of a communication terminal apparatus according to the fifth preferred embodiment of the present invention. An RFID tag 106 includes an antenna element 12 as a loop antenna, an impedance conversion circuit 35, an RFIC 91, and a baseband IC 92. In addition, a reader/writer 105 includes a reader/writer control circuit 93, an impedance conversion circuit 25, and an antenna element 13 as a loop antenna.

A wireless IC chip 70 includes an RFIC defining a high frequency circuit, and a baseband IC defining a logical circuit. The impedance conversion circuit described in any of the first to the fourth preferred embodiments is preferably included in the impedance conversion circuits 25 and 35.

The impedance of the antenna element 12 is higher than the impedance of the antenna side port of the RFIC, and the impedance conversion circuit 35 performs the impedance matching between the antenna element 12 and the antenna side port of the RFIC. In addition, the impedance of the antenna element 13 is higher than the impedance of the antenna side port of the reader/writer control circuit 93, and the impedance conversion circuit 25 performs the impedance matching between the antenna element 13 and the antenna side port of the reader/writer control circuit 93.

In this way, since the RFID system provides an environment in which a RFID tag is manually operated, the impedances of the antenna elements 12 and 13 are likely to change. However, by disposing the impedance conversion circuits 25 and 35, the impedance-matching state can be stabilized. Specifically, the impedance conversion circuits 25 and 35 can have frequency characteristic adjustment functions such as setting of a center frequency, setting of a pass band width, and setting of impedance matching that are important for antenna design, so that the antenna design can be easily performed in consideration of only the directivity and gain of the antenna elements 12 and 13.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
an antenna element; and
an impedance conversion circuit connected to the antenna element; wherein
the impedance conversion circuit includes a transformer circuit in which a first inductance element and a second inductance element are coupled to each other through a mutual inductance;
the first inductance element includes a first end connected to a feeding circuit, and a second end connected to ground;
the second inductance element includes a first end connected to the feeding circuit, and a second end connected to the antenna element; and
the mutual inductance is larger than an inductance of the second inductance element.

2. The antenna device according to claim 1, wherein:
the first inductance element includes a first coil conductor and a second coil conductor;
the second inductance element includes a third coil conductor and a fourth coil conductor;
the first coil conductor and the second coil conductor are wound so as to be electromagnetically coupled by a closed loop of a first magnetic flux generated by the first coil conductor and the second coil conductor; and
the third coil conductor and the fourth coil conductor are wound so as to be electromagnetically coupled by a closed loop of a second magnetic flux generated by the third coil conductor and the fourth coil conductor.

3. The antenna device according to claim 2, wherein the first coil conductor, the second coil conductor, the third coil conductor, and the fourth coil conductor are wound so that a magnetic flux passing through the closed loop of the first magnetic flux and a magnetic flux passing through the closed loop of the second magnetic flux are in directions opposite to each other.

4. The antenna device according to claim 2, wherein:
the first coil conductor and the third coil conductor are coupled to each other through a magnetic field and an electric field;
the second coil conductor and the fourth coil conductor are coupled to each other through a magnetic field and an electric field; and
when an alternating current flows in the first inductance element, a direction of a current that flows in the second inductance element as a result of coupling through the magnetic field is a same as a direction of a current that flows in the second inductance element as a result of coupling through the electric field.

5. The antenna device according to claim 2, wherein the first coil conductor, the second coil conductor, the third coil conductor, and the fourth coil conductor include conductor patterns in a laminate in which a plurality of dielectric layers or magnetic layers are laminated on each other.

6. The antenna device according to claim 5, wherein:
a winding axis of the first coil conductor, a winding axis of the second coil conductor, a winding axis of the third coil conductor, and a winding axis of the fourth coil conductor are oriented in a lamination direction of the laminate;
the winding axes of the first coil conductor and the second coil conductor are juxtaposed so that the respective winding axes have a different relationship;
the winding axes of the third coil conductor and the fourth coil conductor are juxtaposed so that the respective winding axes have a different relationship; and
a winding area of the first coil conductor and a winding area of the third coil conductor overlap each other at least partially in a plan view and a winding area of the second coil conductor and a winding area of the fourth coil conductor overlap each other at least partially in a plan view.

7. The antenna device according to claim 2, wherein:
the impedance conversion circuit further includes a fifth coil conductor and a sixth coil conductor;
the fifth coil conductor and the sixth coil conductor are connected in series to define a third inductance element;
the fifth coil conductor and the sixth coil conductor are wound so as to be electromagnetically coupled by a closed loop of a third magnetic flux that is generated by the fifth coil conductor and the sixth coil conductor;
the third inductance element includes a first end connected to the feeding circuit, and a second end connected to the ground; and
the first coil conductor, the second coil conductor, the third coil conductor, the fourth coil conductor, the fifth coil conductor, and the sixth coil conductor are arranged so that a magnetic flux passing through the closed loop of the second magnetic flux is sandwiched between a magnetic flux passing through the closed loop of the first magnetic flux and a magnetic flux wound around the closed loop of the third magnetic flux.

8. The antenna device according to claim 2, wherein:
the impedance conversion circuit further includes a fifth coil conductor and a sixth coil conductor;
the fifth coil conductor and the sixth coil conductor are connected in series to define a third inductance element;
the fifth coil conductor and the sixth coil conductor are wound so as to be electromagnetically coupled by a closed loop of a third magnetic flux that is generated by the fifth coil conductor and the sixth coil conductor;
the third inductance element includes a first end connected to the feeding circuit, and a second end connected to the antenna element; and
the first coil conductor, the second coil conductor, the third coil conductor, the fourth coil conductor, the fifth coil conductor, and the sixth coil conductor are so arranged that a magnetic flux passing through the closed loop of the first magnetic flux is sandwiched between a magnetic flux passing through the closed loop of the second magnetic flux and a magnetic flux wound around the closed loop of the third magnetic flux.

9. The antenna device according to claim 1, wherein an impedance of the antenna element is approximately two times larger than an impedance of the feeding circuit.

10. The antenna device according to claim 1, wherein the impedance conversion circuit is configured to operate as a transformer.

11. A communication terminal apparatus comprising:
an antenna device including:
an antenna element;
a feeding circuit; and
an impedance conversion circuit connected between the antenna element and the feeding circuit, wherein:
the impedance conversion circuit includes a transformer circuit in which a first inductance element and a second inductance element are coupled to each other through a mutual inductance;
the first inductance element includes a first end connected to the feeding circuit, and a second end connected to ground, respectively;
the second inductance element includes a first end connected to the feeding circuit, and a second end connected to the antenna element, respectively; and
the mutual inductance is larger than an inductance of the second inductance element.

12. The communication terminal apparatus according to claim 11, wherein:
the first inductance element includes a first coil conductor and a second coil conductor;
the second inductance element includes a third coil conductor and a fourth coil conductor;
the first coil conductor and the second coil conductor are wound so as to be electromagnetically coupled by a closed loop of a first magnetic flux generated by the first coil conductor and the second coil conductor; and
the third coil conductor and the fourth coil conductor are wound so as to be electromagnetically coupled by a closed loop of a second magnetic flux generated by the third coil conductor and the fourth coil conductor.

13. The communication terminal apparatus according to claim 12, wherein the first coil conductor, the second coil conductor, the third coil conductor, and the fourth coil conductor are wound so that a magnetic flux passing through the closed loop of the first magnetic flux and a magnetic flux passing through the closed loop of the second magnetic flux are in directions opposite to each other.

14. The communication terminal apparatus according to claim 12, wherein:
the first coil conductor and the third coil conductor are coupled to each other through a magnetic field and an electric field;
the second coil conductor and the fourth coil conductor are coupled to each other through a magnetic field and an electric field; and
when an alternating current flows in the first inductance element, a direction of a current that flows in the second inductance element as a result of coupling through the magnetic field is a same as a direction of a current that flows in the second inductance element as a result of coupling through the electric field.

15. The communication terminal apparatus according to claim 12, wherein
the first coil conductor, the second coil conductor, the third coil conductor, and the fourth coil conductor include conductor patterns in a laminate in which a plurality of dielectric layers or magnetic layers are laminated on each other.

16. The communication terminal apparatus according to claim 15, wherein:
a winding axis of the first coil conductor, a winding axis of the second coil conductor, a winding axis of the third coil conductor, and a winding axis of the fourth coil conductor are oriented in a lamination direction of the laminate;
the winding axes of the first coil conductor and the second coil conductor are juxtaposed so that the respective winding axes have a different relationship;
the winding axes of the third coil conductor and the fourth coil conductor are juxtaposed so that the respective winding axes have a different relationship; and
a winding area of the first coil conductor and a winding area of the third coil conductor overlap each other at least partially in a plan view and a winding area of the second coil conductor and a winding area of the fourth coil conductor overlap each other at least partially in a plan view.

17. The communication terminal apparatus according to claim 12, wherein:
the impedance conversion circuit further includes a fifth coil conductor and a sixth coil conductor;
the fifth coil conductor and the sixth coil conductor are connected in series to define a third inductance element;

the fifth coil conductor and the sixth coil conductor are wound so as to be electromagnetically coupled by a closed loop of a third magnetic flux that is generated by the fifth coil conductor and the sixth coil conductor;

the third inductance element includes a first end connected to the feeding circuit, and a second end connected to the ground; and the first coil conductor, the second coil conductor, the third coil conductor, the fourth coil conductor, the fifth coil conductor, and the sixth coil conductor are arranged so that a magnetic flux passing through the closed loop of the second magnetic flux is sandwiched between a magnetic flux passing through the closed loop of the first magnetic flux and a magnetic flux wound around the closed loop of the third magnetic flux.

18. The communication terminal apparatus according to claim 12, wherein:

the impedance conversion circuit further includes a fifth coil conductor and a sixth coil conductor;

the fifth coil conductor and the sixth coil conductor are connected in series to define a third inductance element;

the fifth coil conductor and the sixth coil conductor are wound so as to be electromagnetically coupled by a closed loop of a third magnetic flux that is generated by the fifth coil conductor and the sixth coil conductor;

the third inductance element includes a first end connected to the feeding circuit, and a second end connected to the antenna element; and the first coil conductor, the second coil conductor, the third coil conductor, the fourth coil conductor, the fifth coil conductor, and the sixth coil conductor are so arranged that a magnetic flux passing through the closed loop of the first magnetic flux is sandwiched between a magnetic flux passing through the closed loop of the second magnetic flux and a magnetic flux wound around the closed loop of the third magnetic flux.

19. The communication terminal apparatus according to claim 11, wherein the communication terminal apparatus is an RFID tag.

20. The communication terminal apparatus according to claim 11, further comprising an RFIC and a baseband IC.

* * * * *